(12) United States Patent
Chen et al.

(10) Patent No.: US 12,439,523 B2
(45) Date of Patent: Oct. 7, 2025

(54) ELECTRONIC DEVICE

(71) Applicant: DARWIN PRECISIONS CORPORATION, Hsinchu County (TW)

(72) Inventors: Yi Feng Chen, Hsinchu County (TW); Chia Tsun Huang, Hsinchu County (TW); Keng-Kuei Liang, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 227 days.

(21) Appl. No.: 18/372,062

(22) Filed: Sep. 23, 2023

(65) Prior Publication Data
US 2024/0341036 A1 Oct. 10, 2024

(30) Foreign Application Priority Data

Apr. 10, 2023 (TW) .................................. 112113309

(51) Int. Cl.
H05K 1/18 (2006.01)
H05K 1/03 (2006.01)
H05K 3/32 (2006.01)

(52) U.S. Cl.
CPC ........... *H05K 1/181* (2013.01); *H05K 1/0393* (2013.01); *H05K 3/323* (2013.01); *H05K 2201/0129* (2013.01); *H05K 2201/10818* (2013.01)

(58) Field of Classification Search
CPC .................................................... H05K 1/181
USPC ......................................................... 174/260
See application file for complete search history.

(56) References Cited

U.S. PATENT DOCUMENTS

| | | | | |
|---|---|---|---|---|
| 8,616,899 B1* | 12/2013 | Lin | ......................... | H01R 12/58 439/63 |
| 10,304,353 B1* | 5/2019 | Lozano | ..................... | G06F 8/34 |
| 2002/0024302 A1 | 2/2002 | Wu et al. | | |
| 2008/0166926 A1* | 7/2008 | Seymour | ................... | E04B 2/06 439/701 |

(Continued)

FOREIGN PATENT DOCUMENTS

| | | |
|---|---|---|
| CN | 110612781 A | 12/2019 |
| CN | 113342187 A | 9/2021 |
| TW | I636880 B | 10/2018 |

*Primary Examiner* — Stanley Tso

(57) ABSTRACT

An electronic device includes a substrate, conductive circuit lines, an anisotropic conductive block, and a plastic layer. The substrate has an arrangement surface having a mounting area and a coverage area, and the coverage area surrounds the mounting area. The conductive circuit lines are arranged in the coverage area. Each of the conductive circuit lines partially passes through the mounting area. The anisotropic conductive block includes an anisotropic conductive layer. The anisotropic conductive layer has a first conductive surface, a second conductive surface, and a side surface. The first conductive surface is opposite to the second conductive surface. The side surface is connected between the first conductive surface and the second conductive surface and surrounds the first conductive surface and the second conductive surface. The anisotropic conductive block covers the mounting area through the first conductive surface. The plastic layer surrounds the side surface and covers the coverage area.

7 Claims, 3 Drawing Sheets

(56) References Cited

U.S. PATENT DOCUMENTS

| | | | |
|---|---|---|---|
| 2015/0235753 A1* | 8/2015 | Chatani | H01F 27/2804 |
| | | | 336/200 |
| 2018/0182532 A1* | 6/2018 | Stahr | H01F 27/24 |
| 2021/0118847 A1* | 4/2021 | Chuang | H01L 24/24 |
| 2022/0104378 A1* | 3/2022 | Seymour | F21V 23/06 |
| 2025/0054820 A1* | 2/2025 | Chen | H01L 23/14 |

\* cited by examiner

ELECTRONIC DEVICE

FIELD OF THE INVENTION

The present invention relates to an electronic device, in particular to an electronic device manufactured by combining plastic and an electronic flexible printed circuit board.

BACKGROUND OF THE INVENTION

In-mold electronics is a highly reliable, lightweight, three-dimensional and decorative electronic device. In-mold electronics is manufactured by placing an electronic flexible printed circuit board (substrate) provided with an electronic component in a plastic housing and making it have a three-dimensional appearance. In-mold electronics is suitable for application in various operable electronic products, such as automobiles, household appliances or consumer electronic products, and thus has development potential.

When an electronic device such as the in-mold electronics is electrically connected to other devices, in addition to being electrically connected to other devices through a flat cable extending from an electronic flexible printed circuit board, a connection joint provided on a plastic housing may also be provided on the electronic flexible printed circuit board and is electrically connected to other devices via a circuit line plugged on the connection joint.

SUMMARY OF THE INVENTION

The present invention provides an electronic device having the advantage of being easy to manufacture.

In order to achieve the above advantages, an embodiment of the present invention provides an electronic device, which includes a substrate, conductive circuit lines, an anisotropic conductive block, and a plastic layer. The substrate has an arrangement surface. The arrangement surface has a mounting area and a coverage area, and the coverage area surrounds the mounting area. The conductive circuit lines are arranged in the coverage area. Each of the conductive circuit lines partially passes through the mounting area. The anisotropic conductive block includes an anisotropic conductive layer. The anisotropic conductive layer has a first conductive surface, a second conductive surface, and a side surface. The first conductive surface is opposite to the second conductive surface. The side surface is connected between the first conductive surface and the second conductive surface and surrounds the first conductive surface and the second conductive surface. The anisotropic conductive block covers the mounting area through the first conductive surface. The plastic layer surrounds the side surface and covers the coverage area.

According to an embodiment of the present invention, the anisotropic conductive block is an elastic member.

According to an embodiment of the present invention, the second conductive surface has a plurality of receptacles.

According to an embodiment of the present invention, the anisotropic conductive block further includes two insulating layers. The anisotropic conductive layer is located between the two insulating layers and connects the two insulating layers with the side surface.

According to an embodiment of the present invention, a gap is formed between the side surface of the anisotropic conductive block and a surface of the plastic layer surrounding the side surface.

According to an embodiment of the present invention, the substrate is a flexible substrate.

According to an embodiment of the present invention, the substrate includes a covering portion and a circuit-line-outlet portion. The circuit-line-outlet portion extends from one side of the covering portion. The arrangement surface is located only in the covering portion. The circuit-line-outlet portion has a plurality of flat cables, and the flat cables are electrically connected to the conductive circuit lines.

In summary, the internal electronic components of the electronic device according to the present invention are protected by a plastic layer to be waterproof, dustproof, and aesthetically pleasing. In addition, because an anisotropic conductive block is used as a connector joint on the electronic device for connecting to an external circuit line, the problem of accurately locating a position between a contact point of the connector joint and a conductive circuit to be conducted when manufacturing an electronic device is solved by means of the conductive characteristic of the anisotropic conductive block, which is convenient for manufacture.

Other objectives, features, and advantages of the invention will be further understood from the further technological features disclosed by the embodiments of the invention wherein there are shown and described preferred embodiments of this invention, simply by way of illustration of modes best suited to carry out the invention.

DETAILED DESCRIPTION OF PREFERRED EMBODIMENTS

Figure 1:
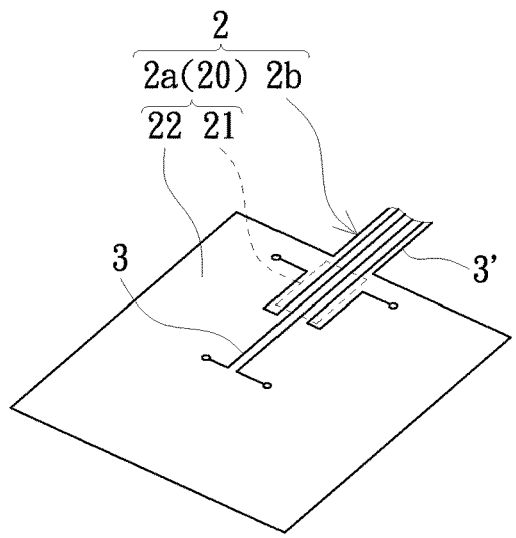
FIG. 1 is a schematic three-dimensional view of a substrate of an electronic device according to an embodiment of the present invention.

In the following text, for example, the terms used in the description of the embodiments according to the invention are: the description of "upper", and "lower", etc. indicating orientations or positional relationships is to be construed in light of the orientation or positional relationships shown in the drawings as being employed. The terminology used is for the purpose of describing the invention only and is not intended to be limiting, i.e. there is no indication or suggestion that the referenced components must be oriented or constructed in a particular orientation. In addition, references to "first", "second", and the like in this description or claims are merely used to name an element or to distinguish between different embodiments or ranges and are not intended to limit the upper or lower limit on the number of components.

Figure 2A:
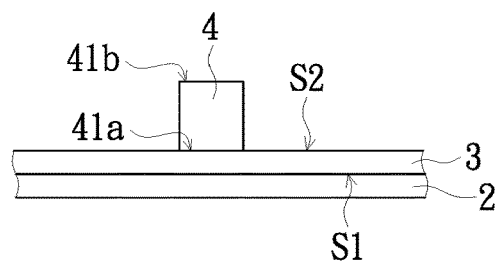
FIGS. 2A and 2B are flow diagrams illustrating a manufacture of an electronic device according to an embodiment of the present invention.
Figure 2B:
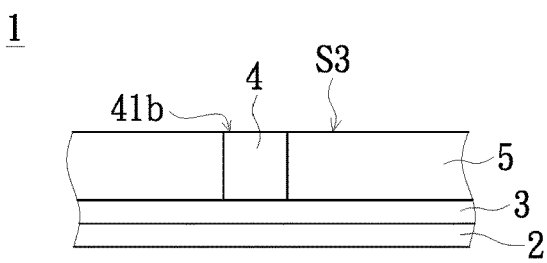
Figure 3A:
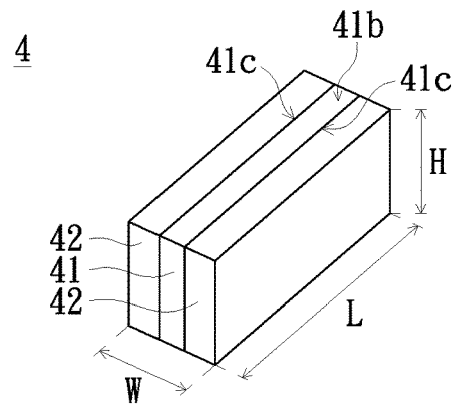
FIG. 3A is a schematic three-dimensional view of an anisotropic conductive block used in an embodiment of the present invention.
Figure 3B:
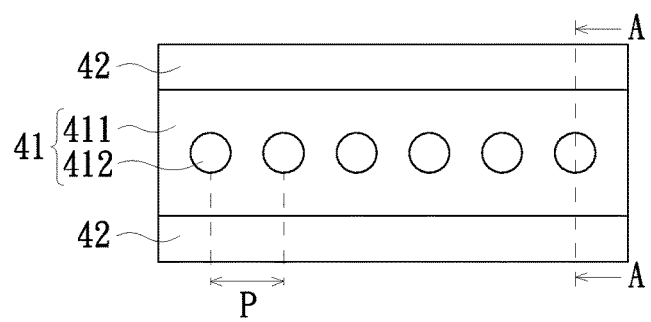
FIG. 3B is a schematic view showing an internal structure of an anisotropic conductive block used in an embodiment of the present invention.
Figure 3C:
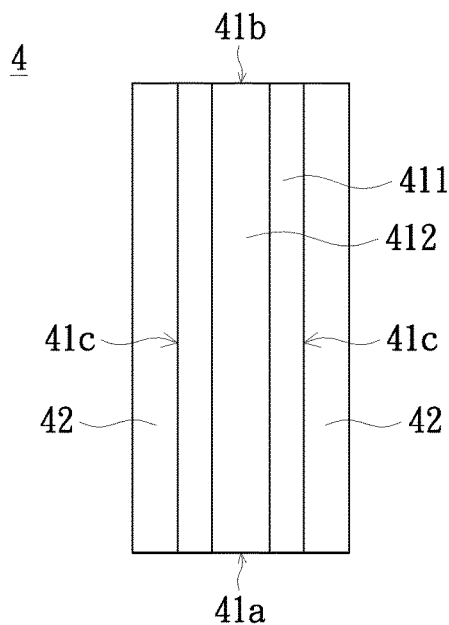
FIG. 3C a schematic cross-sectional view of the internal structure of the anisotropic conductive block, taken along line A-A in FIG. 3B.

FIG. 1 is a schematic three-dimensional view of a substrate of an electronic device according to an embodiment of the present invention. FIGS. 2A and 2B are flow diagrams illustrating a manufacture of an electronic device according to an embodiment of the present invention. FIG. 3A is a schematic three-dimensional view of an anisotropic conductive block used in an embodiment of the present invention. FIG. 3B is a schematic view showing an internal structure of an anisotropic conductive block used in an embodiment of the present invention. FIG. 3C is a schematic cross-sectional view of the internal structure of the anisotropic conductive block, taken along line A-A in FIG. 3B. In addition, in order to explain the structure of the anisotropic conductive block, the sizes of components drawn in FIGS. 3A to 3C are only schematic and are not drawn according to actual sizes.

As shown in FIGS. 1 to 2B, the electronic device 1 of this embodiment is a device using in-mold electronic manufacturing technology. In-mold electronics are abbreviated as IME. The electronic device 1 (see FIG. 2B) includes a substrate 2, conductive circuit lines 3, an anisotropic conductive block 4, and a plastic layer 5. As shown in FIG. 1, the substrate 2 has an arrangement surface 20. The arrangement surface 20 has a mounting area 21 and a coverage area 22 surrounding the mounting area 21. The conductive circuit lines 3 are arranged in the coverage area 22, and each of the conductive circuit lines 3 partially passes through the mounting area 21. As shown in FIGS. 3A and 3C, the anisotropic conductive block 4 includes an anisotropic conductive layer 41. The anisotropic conductive layer 41 has a first conductive surface 41a (see FIG. 2A), a second conductive surface 41b, and a side surface 41c. The first conductive surface 41a is opposite to the second conductive surface 41b. The side surface 41c is connected between the first conductive surface 41a and the second conductive surface 41b and surrounds the first conductive surface 41a and the second conductive surface 41b. The anisotropic conductive block 4 covers the mounting area 21 (see FIG. 1) through the first conductive surface 41a. The plastic layer 5 surrounds the side surface 41c and covers the coverage area 22.

As shown in FIG. 1, the substrate 2 of the electronic device 1 in this embodiment is, for example, a flexible substrate 2 such as a flexible printed circuit board or a flexible flat cable. The substrate 2 is adapted to change its shape through the flexibility to conform to the shape requirements of the electronic device 1. The coverage area 22 on the substrate 2 is, for example, provided with an electronic component (not shown). The electronic component is electrically connected to the conductive circuit lines 3, and the electronic component may be a light-emitting diode (LED), a chip, etc. In the embodiment in which the plastic layer 5 is elastic or the thickness of the plastic layer 5 does not have a sufficient influence on the electronic device 1, the electronic component may be a pressure-sensing component. In other words, the electronic component may be selected as desired. Referring to FIGS. 1 and 2A, the conductive circuit lines 3 are formed on the substrate 2, for example, and the conductive circuit lines 3 have a certain thickness so that the surface S2 of the conductive circuit lines 3 is higher than the surface S1 of the substrate 2, for example.

In this embodiment as shown in FIG. 1, the substrate 2 includes a covering portion 2a and a circuit-line-outlet portion 2b. The circuit-line-outlet portion 2b extends from one side of the covering portion 2a, and the arrangement surface 20 is located only at the covering portion 2a. That is, the plastic layer 5 of the electronic device 1 covers only the covering portion 2a. The circuit-line-outlet portion 2b has a plurality of flat cables 3' electrically connected to the conductive circuit lines 3.

In this embodiment, the electronic device 1 is manufactured, for example, by first placing the anisotropic conductive block 4 on the conductive circuit lines 3 in the mounting area 21 (shown in FIG. 1) on the substrate 2, as shown in FIG. 2A. Then, the plastic layer 5 is made by, for example, plastic injection, as shown in FIG. 2B. In this embodiment, the surface S3 of the plastic layer 5 is, for example, aligned with the second conductive surface 41b of the anisotropic conductive block 4, but the invention is not limited thereto. The manner in which the first conductive surface 41a is connected to the conductive circuit lines 3 is not limited. For example, the anisotropic conductive block 4 may be placed directly on and contact the conductive circuit lines 3, but the invention is not limited thereto.

Referring to FIG. 3A, the anisotropic conductive block 4 of this embodiment is, for example, conductive in a direction of the height H and is non-conductive in a direction of the length L and in a direction of the width W. According to an embodiment, the anisotropic conductive block 4 is, for example, an elastic member and includes an anisotropic conductive layer 41 and two insulating layers 42. The insulating layer 42 is made from, for example, silicone material. The anisotropic conductive layer 41 is located between the two insulating layers 42 and connects the two insulating layers 42 with the side surface 41c by, for example, thermoforming. The anisotropic conductive block 4 is sized to be, for example, 2 mm to 150 mm in length L, 0.4 mm to 7 mm in width W, and 0.8 mm to 25 mm in height H, but the invention is not limited thereto. The size of the anisotropic conductive block 4 may be determined according to the size of the mounting area 21 (the area where the conductive circuit lines 3 are distributed) and the thickness of the plastic layer 5, etc.

As shown in FIGS. 3B and 3C, the anisotropic conductive layer 41 includes, for example, an intermediate material 411 and a plurality of conductive metal wires 412, but the invention is not limited thereto. The intermediate material 411 of the anisotropic conductive layer 41 includes, for example, silica gel and surrounds the conductive metal wires 412. The length of the conductive metal wire 412 is, for example, equal to the height H of the anisotropic conductive block 4 and extends from the first conductive surface 41a to the second conductive surface 41b. The wire diameter of the conductive metal wire 412 is, for example, 0.023 mm to 0.03 mm, but not limited thereto. The conductive metal wires 412 in the anisotropic conductive layer 41 are parallel to each other at a pitch of, for example, 0.05 to 0.25 mm, for example, but not limited thereto. The arrangement of the conductive metal wires 412 depicted in FIG. 3B is merely illustrative and the conductive metal wires 412 can be arranged as desired while maintaining the conductive anisotropy.

Thus, when placed on the conductive circuit lines 3, the qanisotropic conductive block 4 can be regarded as an extension of the conductive circuit lines 3 in the thickness direction of the anisotropic conductive block 4 to penetrate the plastic layer 5 for connection with other electronic components such as wires or circuit boards. Due to the characteristics of the anisotropic conductive block 4, it is only necessary to make sure that the first conductive surface 41a of the anisotropic conductive layer 41 contacts all of the conductive circuit lines 3 of the mounting portion at the time of manufacture, thereby requiring lower tolerances with respect to conventional connector mounting arrangements having pins or contacts.

Furthermore, because the anisotropic conductive block 4, the substrate 2, and the conductive circuit lines 3 can be connected and then put together into a mold to eject a plastic layer 5 at the time of manufacture, it is possible to avoid using a slider to manufacture an opening of the anisotropic conductive block 4 on the plastic layer 5 and to avoid the slider causing damage to components such as the substrate 2 or the conductive circuit lines 3. In addition, because of having elasticity, the anisotropic conductive block 4 can be connected with the substrate 2 and the conductive circuit lines 3 and then put together into the mold during the manufacture process. Thus, even if the anisotropic conductive block 4 is pressed by the mold during the manufacture process, the problems such as pressure damage of the substrate 2 or the conductive circuit lines 3 cannot easily be derived through the elastic deformation of the anisotropic conductive block 4, and the tolerance requirements of the mold can be reduced.

As described above, the electronic device 1, the substrate 2, and the conductive circuit lines 3 of this embodiment are protected by the plastic layer 5. In addition, the substrate 2 and the conductive circuit lines 3 can be prevented from being damaged during the manufacture of the plastic layer 5 by using the anisotropic conductive block 4 as a connector joint of the electronic device 1 for connecting to the external line and by solving the problem that the contact of the connector joint and the conductive circuit lines 3 to be conducted need to be accurately positioned during the manufacture of the electronic device 1 by means of the conductive characteristic of the anisotropic conductive block 4.

Figure 4:
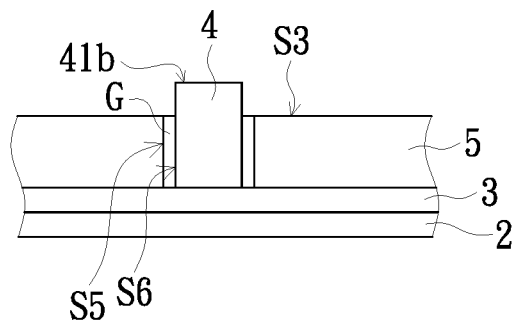
FIG. 4 is a schematic cross-sectional view of an electronic device 1 according to another embodiment of the present invention.

FIG. 4 is a schematic cross-sectional view of an electronic device 1 according to another embodiment of the present invention. Referring to FIG. 4, in this embodiment, the second conductive surface 41b of the anisotropic conductive block 4 is higher than the surface S3 of the plastic layer 5, for example, to facilitate the connection to other electronic devices such as flat cables, etc. In addition, there is a gap G between the side surface S6 of the anisotropic conductive block 4 and the surface S5 of the adjacent plastic layer 5, for example. This gap G is, for example, generated when the anisotropic conductive block 4 is expanded laterally (see FIG. 3A, in a direction other than the direction of the height L), when the anisotropic conductive block 4 is pressed and fixed by an injection mold (not shown) after the injection of the plastic layer 5 is performed, and when the anisotropic conductive block 4 is not pressed by the injection mold after the injection of the plastic layer 5, the anisotropic conductive block 4 returns to its original size, but is not limited thereto.

Figure 5:
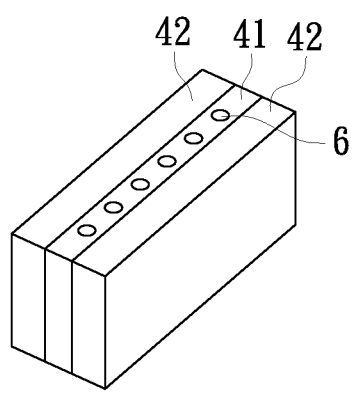
FIG. 5 is a schematic diagram of an anisotropic conductive block used in another embodiment of the present invention.

FIG. 5 is a schematic diagram of an anisotropic conductive block 4 used in another embodiment of the present invention. In this embodiment, the anisotropic conductive block 4 is, for example, an elastic member, and a plurality of receptacles 6 are formed on the second conductive surface 41b (see FIG. 3A for the position) of the anisotropic conductive layer 41. When other electronic components such as flat cables (not shown) are connected to the anisotropic conductive block 4, alignment can be performed through the receptacles 6, or a part thereof can be inserted into the receptacles 6 and fixed to the anisotropic conductive block 4 by pressing through the wall surface of the receptacles 6.

In other embodiments similar to the one shown in FIG. 5 with the receptacles 6, the number of the receptacles 6 corresponds, for example, to the number of the conductive circuit lines 3 on the mounting portion and the positions of the receptacles 6 correspond to the positions of the conductive circuit lines 3 on the mounting area 21. The receptacles 6 are formed, for example, by connecting the anisotropic conductive blocks 4 to the substrate 2 and then are processed by other means, for example, by needling.

As described above, the internal electronic components of the electronic device according to the present invention are protected by a plastic layer to be waterproof, dustproof and aesthetically pleasing. In addition, because an anisotropic conductive block is used as a connector joint on the electronic device for connecting to an external circuit line, the problem of accurately locating a position between a contact point of the connector joint and a conductive circuit to be conducted when manufacturing an electronic device is solved by means of the conductive characteristic of the anisotropic conductive block, which is convenient for manufacture.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic device, comprising:
    a substrate, having an arrangement surface, wherein the arrangement surface has a mounting area and a coverage area, and the coverage area surrounds the mounting area;
    a plurality of conductive circuit lines, arranged in the coverage area, wherein each of the conductive circuit lines partially passes through the mounting area;
    an anisotropic conductive block, comprising an anisotropic conductive layer, wherein the anisotropic conductive layer has a first conductive surface, a second conductive surface, and a side surface, the first conductive surface is opposite to the second conductive surface, the side surface is connected between the first conductive surface and the second conductive surface and surrounds the first conductive surface and the second conductive surface, and the anisotropic conductive block covers the mounting area through the first conductive surface; and
    a plastic layer, surrounding the side surface and covering the coverage area.

2. The electronic device according to claim 1, wherein the anisotropic conductive block is an elastic member.

3. The electronic device according to claim 2, wherein the second conductive surface has a plurality of receptacles.

4. The electronic device according to claim 1, wherein the anisotropic conductive block further comprises two insulating layers, and the anisotropic conductive layer is located between the two insulating layers and connects the two insulating layers with the side surface.

5. The electronic device according to claim 1, wherein a gap is formed between the side surface of the anisotropic conductive block and a surface of the plastic layer surrounding the side surface.

6. The electronic device according to claim 1, wherein the substrate is a flexible substrate.

7. The electronic device according to claim 1, wherein the substrate comprises a covering portion and a circuit-line-outlet portion, the circuit-line-outlet portion extends from one side of the covering portion, the arrangement surface is located only in the covering portion, the circuit-line-outlet portion has a plurality of flat cables, and the flat cables are electrically connected with the conductive circuit lines.

* * * * *